United States Patent
Tung et al.

(10) Patent No.: US 11,683,914 B2
(45) Date of Patent: Jun. 20, 2023

(54) ELECTRONIC DEVICE AND HEAT DISSIPATION ASSEMBLY

(71) Applicants: Inventec (Pudong) Technology Corporation, Shanghai (CN); INVENTEC CORPORATION, Taipei (TW)

(72) Inventors: Kai-Yang Tung, Taipei (TW); Hung-Ju Chen, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/349,153

(22) Filed: Jun. 16, 2021

(65) Prior Publication Data

US 2022/0386512 A1 Dec. 1, 2022

(30) Foreign Application Priority Data

May 25, 2021 (CN) .......................... 202110573932.5

(51) Int. Cl.
*H05K 7/20* (2006.01)
*F28D 15/02* (2006.01)

(52) U.S. Cl.
CPC ..... *H05K 7/20809* (2013.01); *F28D 15/0266* (2013.01); *H05K 7/20245* (2013.01); *H05K 7/20309* (2013.01); *H05K 7/20318* (2013.01)

(58) Field of Classification Search
CPC ............ F28D 15/0266; H05K 7/20245; H05K 7/20309; H05K 7/20318; H05K 7/20809
See application file for complete search history.

(56) References Cited

U.S. PATENT DOCUMENTS 6,360,814 B1 * 3/2002 Tanaka .................. H01L 23/427
361/699
6,643,132 B2 * 11/2003 Faneuf ............... H05K 7/20809
165/80.4

(Continued)

FOREIGN PATENT DOCUMENTS

EP 1793306 A2 * 6/2007 ............... G06F 1/20

*Primary Examiner* — Gordon A Jones
(74) *Attorney, Agent, or Firm* — Locke Lord LLP; Tim Tingkang Xia, Esq.

(57) ABSTRACT

An electronic device connected to external heat dissipation device and including chassis, heat source, and heat dissipation assembly. Heat dissipation assembly includes evaporator, tubing, and liquid-cooling plate. Evaporator is in thermal contact with heat source. Tubing includes evaporation portion and condensation portion. Evaporation portion is in fluid communication with condensation portion and in thermal contact with evaporator. Liquid-cooling plate is disposed on chassis and spaced apart from heat source. Liquid-cooling plate includes liquid-cooling accommodation space and is configured to be in fluid communication with external heat dissipation device. Condensation portion is located in liquid-cooling accommodation space. Condensation portion includes first tube part, second tube part and connecting tube parts. Two opposite ends of each connecting tube part are respectively in fluid communication with first and second tube parts. Connecting tube parts are connected in parallel. First and second tube parts are in fluid communication with evaporation portion.

5 Claims, 6 Drawing Sheets

(56) References Cited

U.S. PATENT DOCUMENTS

| | | | | |
|---|---|---|---|---|
| 2002/0195242 | A1* | 12/2002 | Garner | F28D 15/043 165/274 |
| 2006/0262505 | A1* | 11/2006 | Cheng | F28D 15/0275 361/688 |
| 2020/0166279 | A1* | 5/2020 | Adomat | F28D 1/0475 |
| 2021/0033351 | A1* | 2/2021 | Rottoli | F28D 7/1623 |

* cited by examiner

ELECTRONIC DEVICE AND HEAT DISSIPATION ASSEMBLY

CROSS-REFERENCE TO RELATED APPLICATIONS

This non-provisional application claims priority under 35 U.S.C. § 119(a) on Patent Application No(s). 202110573932.5 filed in China, on May 25, 2021, the entire contents of which are hereby incorporated by reference.

BACKGROUND OF THE INVENTION

Technical Field of the Invention

The invention relates to an electronic device and a heat dissipation device, more particularly to an electronic device and a heat dissipation device including a liquid-cooling plate that is configured to accommodate a liquid coolant.

Description of the Related Art

In general, in an open-loop thermosiphon system of a server, a condensation portion of a tube is in thermal contact with an outer surface of a top cover of the liquid-cooling plate, and the tube and the liquid-cooling plate are disposed in a chassis of the server. In addition, the liquid-cooling plate is in fluid communication with an external heat dissipation device outside the chassis via another tube. In this way, the liquid coolant circulated between the external heat dissipation device and the liquid-cooling plate can cool the working fluid in the condensation portion of the tube in the thermosiphon system of the server.

However, since the condensation portion of the tube is in thermal contact with the outer surface of the top cover of the liquid-cooling plate, heat is transferred between the working fluid in the condensation portion and the liquid coolant in the liquid-cooling plate via a wall of the tube and the top cover of the liquid-cooling plate. Therefore, heat is ineffectively transferred between the working fluid in the condensation portion and the liquid coolant in the liquid-cooling plate since there are too many media (the wall of the tube and the top cover) between them.

Thus, some liquid-cooling plates are replaced by a tube sleeve having a large diameter and configured to be sleeved on the tube. With such configuration, heat is transferred between the working fluid in the condensation portion and the liquid coolant in the liquid-cooling plate merely via the wall of the tube. However, in a case that there are a plurality of condensation portions for increasing the flow rate of the working fluid therein, the arrangement of such tube sleeve on the condensation portions may be complex and troublesome. Accordingly, the open-loop thermosiphon system is difficult to be applied to a heat source generating a large amount of heat.

SUMMARY OF THE INVENTION

The invention is to provide an electronic device and a heat dissipation device to allow heat to be effectively transferred between the working fluid in the condensation portion and the liquid coolant in the liquid-cooling plate.

One embodiment of this invention provides an electronic device configured to be connected to an external heat dissipation device and including a chassis, a heat source, and a heat dissipation assembly. The heat source is disposed on the chassis. The heat dissipation assembly includes an evaporator, a tubing, and a liquid-cooling plate. The evaporator is in thermal contact with the heat source. The tubing includes an evaporation portion and a condensation portion. The evaporation portion is in fluid communication with the condensation portion and is in thermal contact with the evaporator. The liquid-cooling plate is disposed on the chassis and is spaced apart from the heat source. The liquid-cooling plate includes a liquid-cooling accommodation space and is configured to be in fluid communication with the external heat dissipation device. The condensation portion of the tubing is located in the liquid-cooling accommodation space. The condensation portion of the tubing includes a first tube part, a second tube part and a plurality of connecting tube parts. Two opposite ends of each of the plurality of connecting tube parts are respectively in fluid communication with the first tube part and the second tube part. The plurality of connecting tube parts are connected in parallel. The first tube part and the second tube part are in fluid communication with the evaporation portion.

Another embodiment of this invention provides a heat dissipation assembly configured to be connected to an external heat dissipation device and be in thermal contact with a heat source. The heat dissipation assembly includes an evaporator, a tubing, and a liquid-cooling plate. The evaporator is configured to be in thermal contact with the heat source. The tubing includes an evaporation portion and a condensation portion. The evaporation portion is in fluid communication with the condensation portion and is in thermal contact with the evaporator. The liquid-cooling plate is configured to be spaced apart from the heat source. The liquid-cooling plate includes a liquid-cooling accommodation space and is configured to be in fluid communication with the external heat dissipation device. The condensation portion of the tubing is located in the liquid-cooling accommodation space. The condensation portion of the tubing includes a first tube part, a second tube part and a plurality of connecting tube parts. Two opposite ends of each of the plurality of connecting tube parts are respectively in fluid communication with the first tube part and the second tube part. The plurality of connecting tube parts are connected in parallel. The first tube part and the second tube part are in fluid communication with the evaporation portion.

According to the electronic device and the heat dissipation assembly disclosed by the above embodiments, the condensation portion of the tubing is located in the liquid-cooling accommodation space of the liquid-cooling plate that is configured for the liquid coolant to flow therein. Thus, heat can be transferred between the working fluid in the condensation portion of the tubing and the liquid coolant in the liquid-cooling plate merely via the wall of the condensation portion instead of via both of the top cover of the liquid-cooling plate and the wall of the condensation portion. In this way, heat can be effectively transferred between the working fluid in the condensation portion of the tubing and the liquid coolant in the liquid-cooling plate. Also, the connecting tube parts that are connected in parallel increase the flow rate of the working fluid in the condensation portion. Thus, the heat dissipation assembly is allowed to be applied to the heat source generating a large amount of heat.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
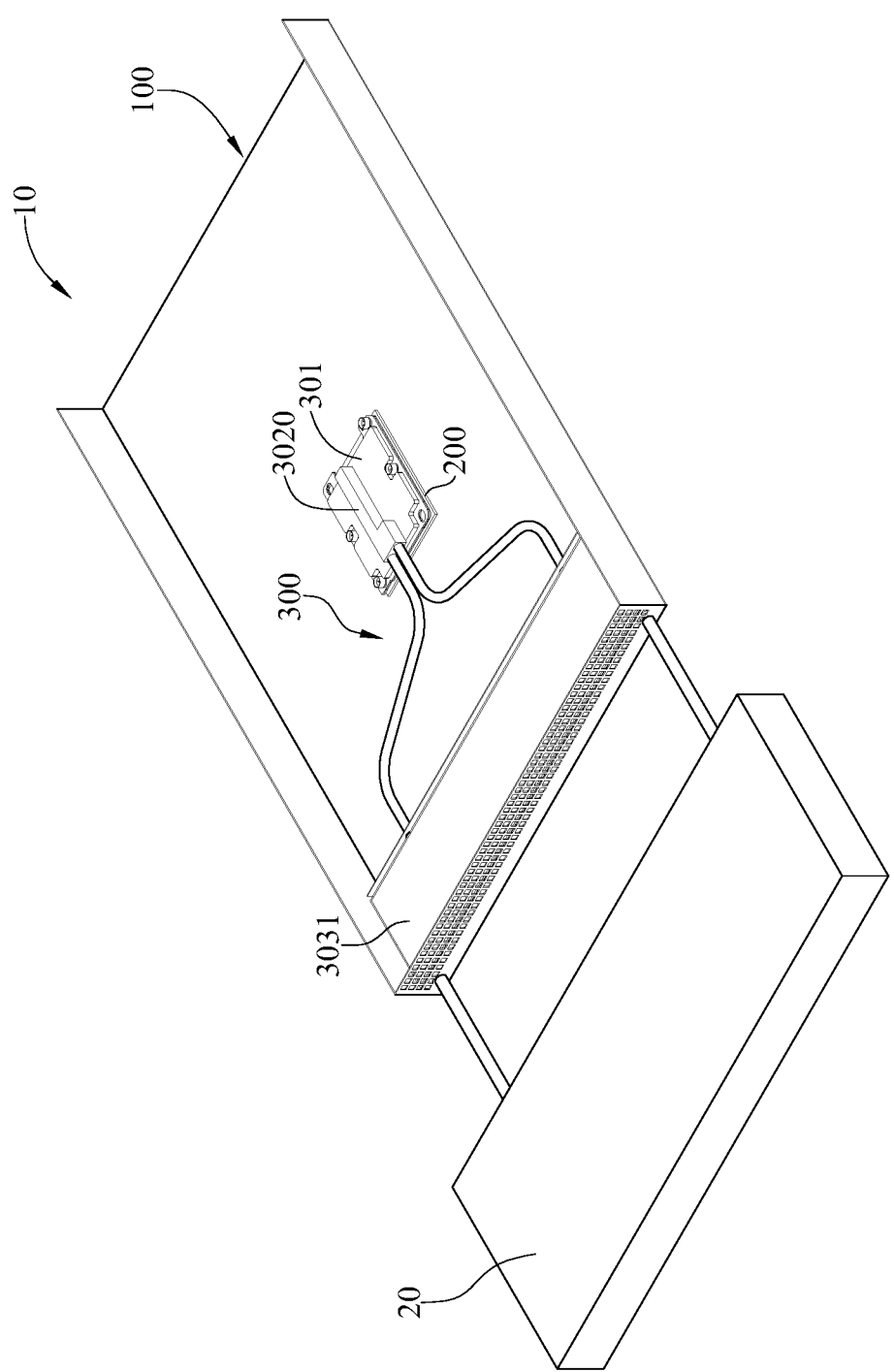
FIG. 1 is a perspective view of an electronic device according to a first embodiment of the invention and an external heat dissipation device.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
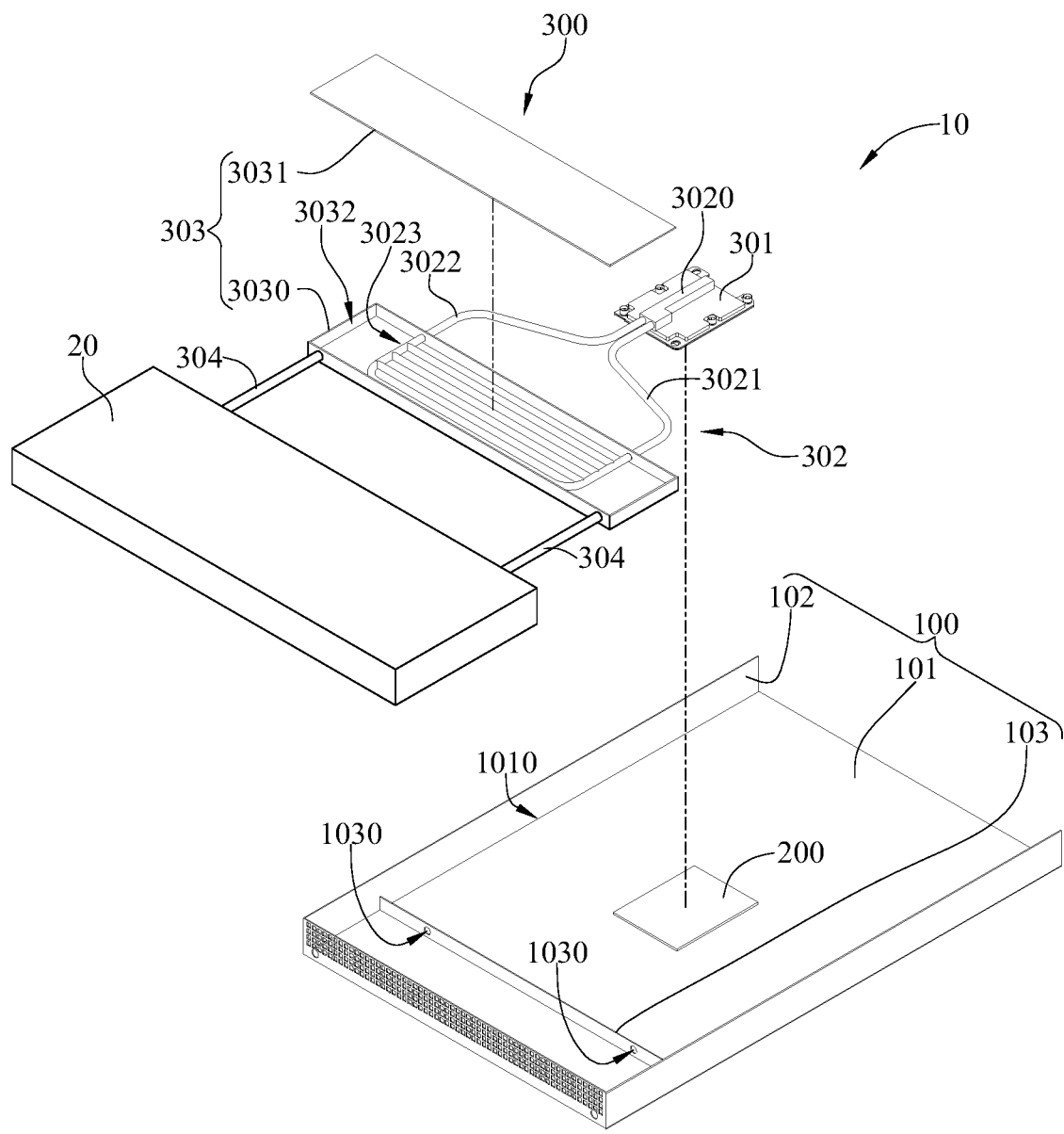
FIG. 2 is an exploded view of the electronic device and the external heat dissipation device in FIG. 1.

Please refer to FIGS. 1 and 2, where FIG. 1 is a perspective view of an electronic device 10 according to a first embodiment of the invention and an external heat dissipation device 20, and FIG. 2 is an exploded view of the electronic device 10 and the external heat dissipation device 20 in FIG. 1.

In this embodiment, the electronic device 10 is, for example, a server. In this embodiment, the electronic device 10 is configured to be connected to the external heat dissipation device 20. The electronic device 10 includes a chassis 100, a heat source 200 and a heat dissipation assembly 300.

In this embodiment, the chassis 100 includes a bottom plate 101, a wall 102 and a partition 103. The wall 102 stands on a peripheral edge 1010 of the bottom plate 101, and is, for example, U-shaped. The partition 103 stands on the bottom plate 101 and is connected to two parts of the wall 102 that are parallel to each other. In addition, in this embodiment, the partition 103 has two through holes 1030. The heat source 200 is disposed on the bottom plate 101 and is, for example, a central processing unit or a graphic processing unit.

Figure 3:
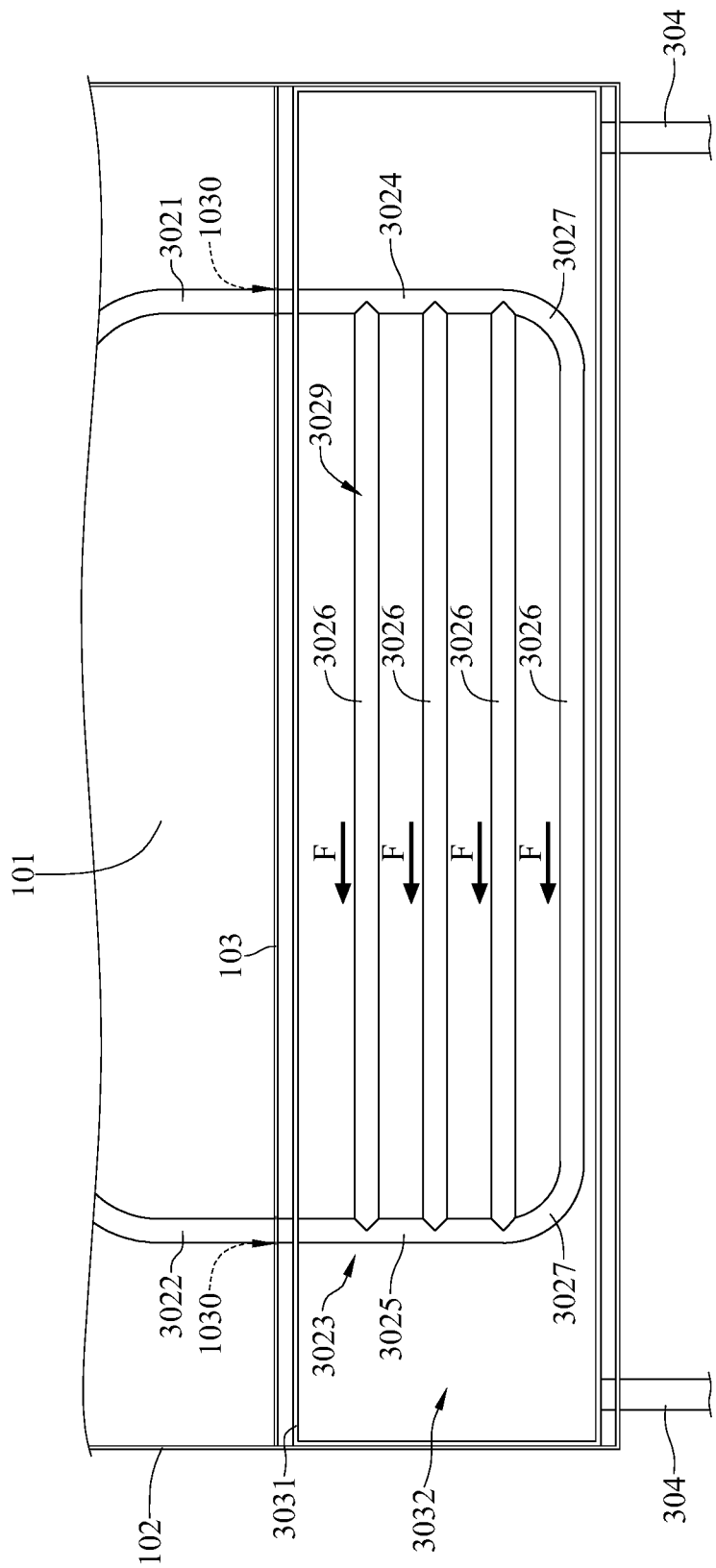
FIG. 3 is a partially enlarged top view of the electronic device in FIG. 1 with the top cover of the liquid-cooling plate being omitted.
Figure 4:
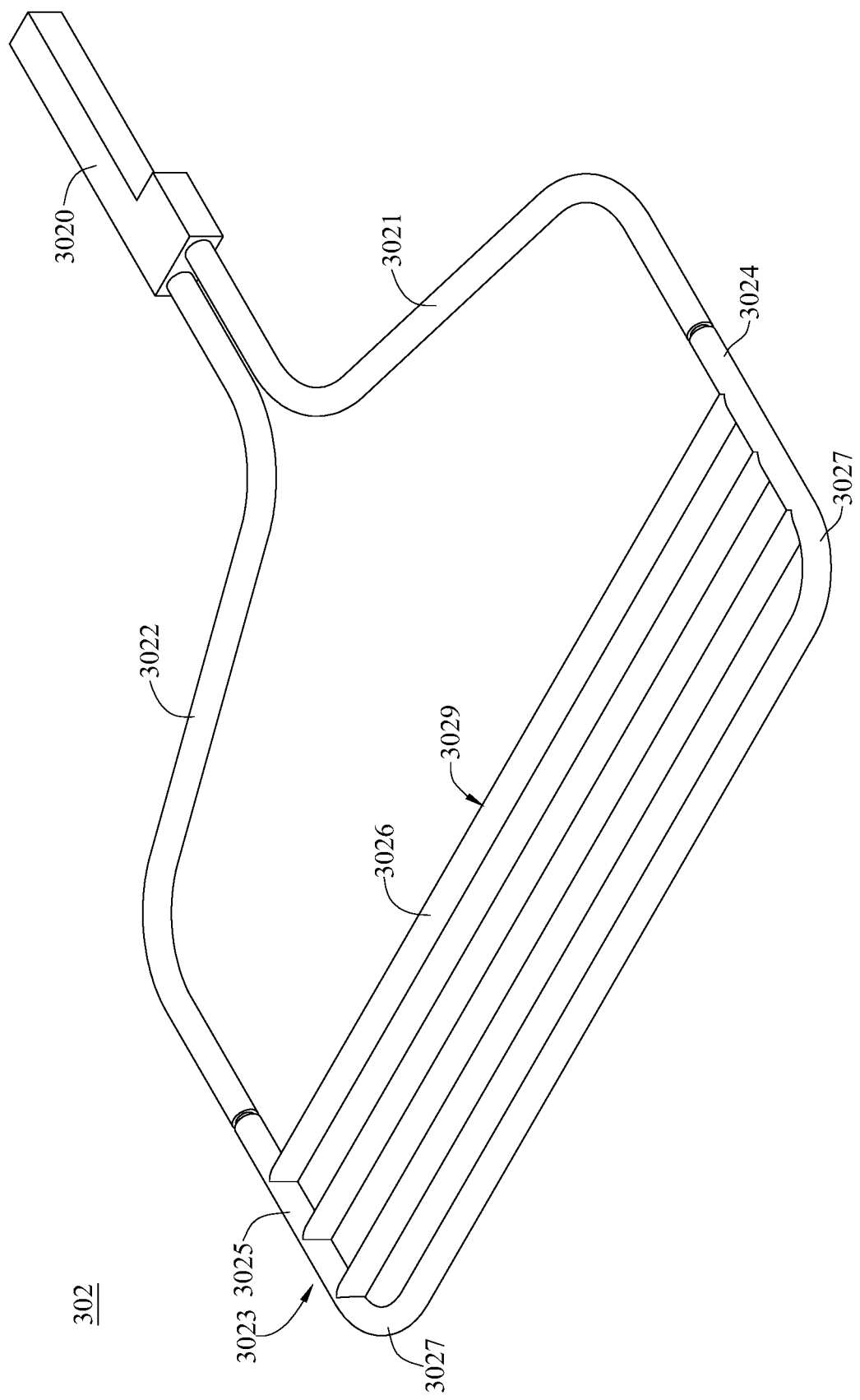
FIG. 4 is a perspective view of a tubing of the electronic device in FIG. 1.

Please refer to FIGS. 1 to 4, where FIG. 3 is a partially enlarged top view of the electronic device 10 in FIG. 1 with a top cover 3031 of a liquid-cooling plate 303 being omitted, and FIG. 4 is a perspective view of a tubing 302 of the electronic device in FIG. 1. In this embodiment, the heat dissipation assembly 300 includes an evaporator 301, the tubing 302, the liquid-cooling plate 303 and two tubes 304.

The evaporator 301 is in thermal contact with the heat source 200. In this embodiment, a working fluid (not shown) is configured to flow in the tubing 302, and the tubing 302 includes an evaporation portion 3020, a first connecting portion 3021, a second connecting portion 3022 and a condensation portion 3023. The evaporation portion 3020 is in fluid communication with the condensation portion 3023 via the first connecting portion 3021 and the second connecting portion 3022. Two opposite ends of the first connecting portion 3021 are respectively in fluid communication with the evaporation portion 3020 and the condensation portion 3023. Two opposite ends of the second connecting portion 3022 are respectively in fluid communication with the evaporation portion 3020 and the condensation portion 3023. The evaporation portion 3020 is in thermal contact with the evaporator 301 and is located on a side of the evaporator 301 that is located away from the heat source 200. In this embodiment, the first connecting portion 3021 and the second connecting portion 3022 are respectively disposed through the two through holes 1030 of the partition 103.

The condensation portion 3023 of the tubing 302 includes a first tube part 3024, a second tube part 3025 and a plurality of connecting tube parts 3026. Two opposite ends of each connecting tube part 3026 are respectively in fluid communication with the first tube part 3024 and the second tube part 3025 so that the connecting tube parts 3026 are connected in parallel. The first tube part 3024 and the second tube part 3025 are respectively in fluid communication with the first connecting portion 3021 and the second connecting portion 3022.

Note that in this embodiment, two opposite ends of the connecting tube part 3026 that is located farthest away from the first connecting portion 3021 and the second connecting portion 3022 among the connecting tube parts 3026 are respectively connected to the first tube part 3024 and the second tube part 3025 respectively via two curved parts 3027 of the condensation portion 3023, thereby allowing the working fluid to flow smoothly in the condensation portion 3023.

Further, in this embodiment, an outer circumferential surface 3029 of the connecting tube parts 3026 is flat. That is, there is no raised areas or indentations on the outer circumferential surface 3029. In addition, as shown in FIG. 3, in this embodiment, extension directions F of the connecting tube parts 3026 are substantially parallel to one another.

In other embodiments, the condensation portion may not include the two curved parts and the connecting tube part that is located farthest away from the first connecting portion and the second connecting portion among the connecting tube parts may be directly connected to the first tube part and the second tube part and may be perpendicular to the first tube part and the second tube part. In other embodiments, the extension directions of the connecting tube parts may be non-parallel to one another. In other embodiments, the partition may not include the two through holes, and the first connecting portion and the second connecting portion may rest on a side of the partition that is located away from the bottom plate.

In this embodiment, the liquid-cooling plate 303 includes a base 3030 and the top cover 3031. The base 3030 of the liquid-cooling plate 303 is disposed on the bottom plate 101 of the chassis 100 and is spaced apart from the heat source 200. The top cover 3031 is fixed on a side of the base 3030 that is located away from the bottom plate 101, such that the top cover 3031 and the base 3030 together form a liquid-cooling accommodation space 3032. A liquid coolant is configured to flow in the liquid-cooling accommodation space 3032. The entire of the condensation portion 3023 of the tubing 302 is located in the liquid-cooling accommodation space 3032. The partition 103 is located between the heat source 200 and the base 3030 of the liquid-cooling plate 303 so as to prevent the liquid coolant leaked from the liquid-cooling accommodation space 3032 from further flowing to the heat source 200. Note that in other embodiments, the chassis may not include the partition.

The liquid-cooling accommodation space 3032 of the liquid-cooling plate 303 is in fluid communication with the external heat dissipation device 20 via the two tubes 304.

That is, the liquid coolant is circulated among the liquid-cooling plate 303, the two tubes 304 and the external heat dissipation device 20.

The outer circumferential surfaces of the connecting tube parts are not limited to be flat. Please refer to FIG. 5, there is shown a perspective view of an electronic device according to a second embodiment of the invention. The main difference between the electronic device shown in FIG. 5 and the electronic device shown in FIGS. 1 to 4 is the structure of the condensation portion of the tubing. Thus, only such difference will be described hereinafter, and the remaining part of the electronic device shown in FIG. 5 can be understood through the descriptions made by referring to FIGS. 1 to 4 and thus are not repeatedly described.

Figure 5:
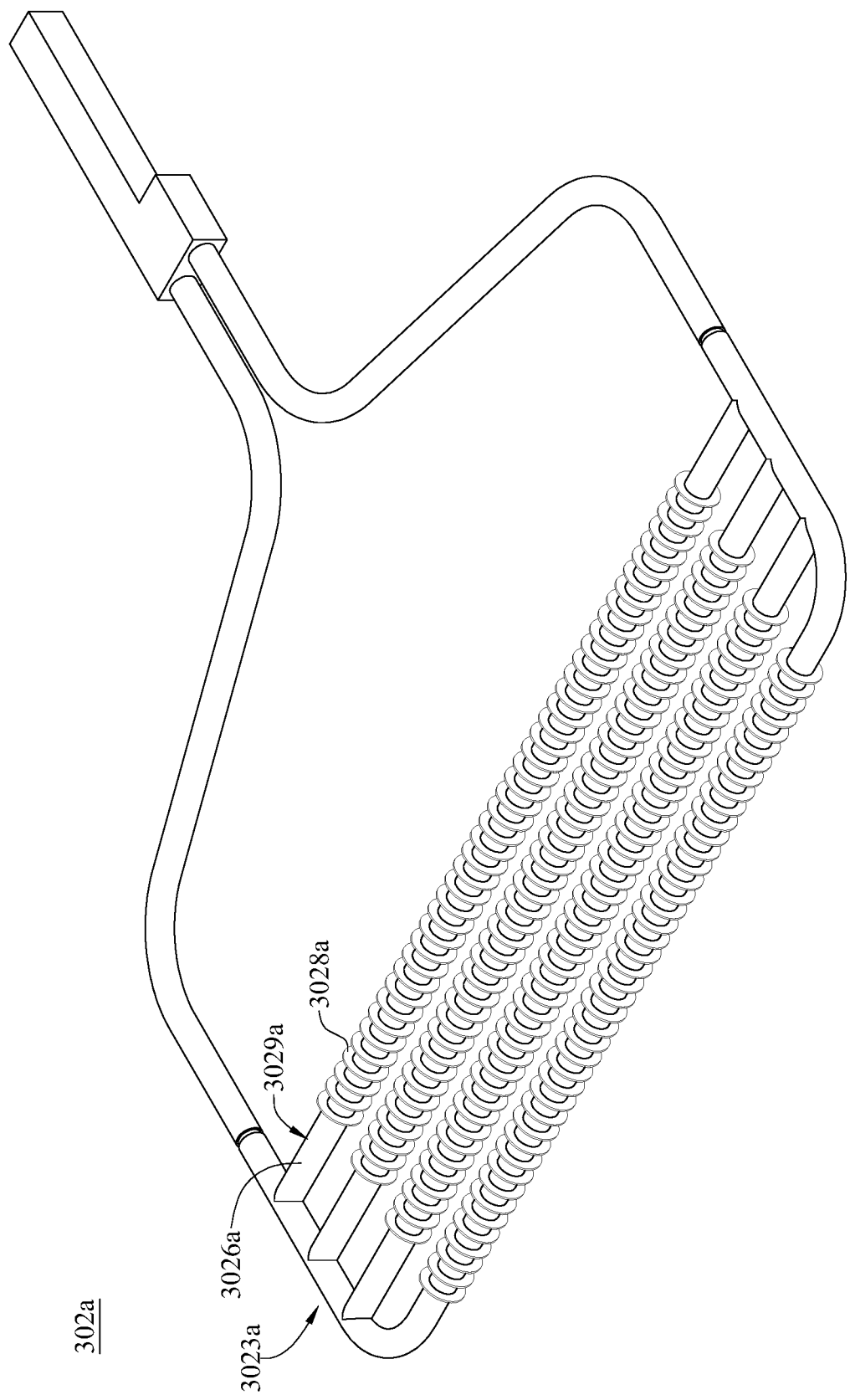
FIG. 5 is a perspective view of an electronic device according to a second embodiment of the invention.

As shown in FIG. 5, in this embodiment, a tubing 302a further includes a plurality of uneven structures 3028a. The uneven structures 3028a are respectively located on outer circumferential surfaces 3029a of connecting tube parts 3026a of a condensation portion 3023a. Also, in this embodiment, the uneven structures 3028a are fins, but the invention is not limited thereto.

Figure 6:
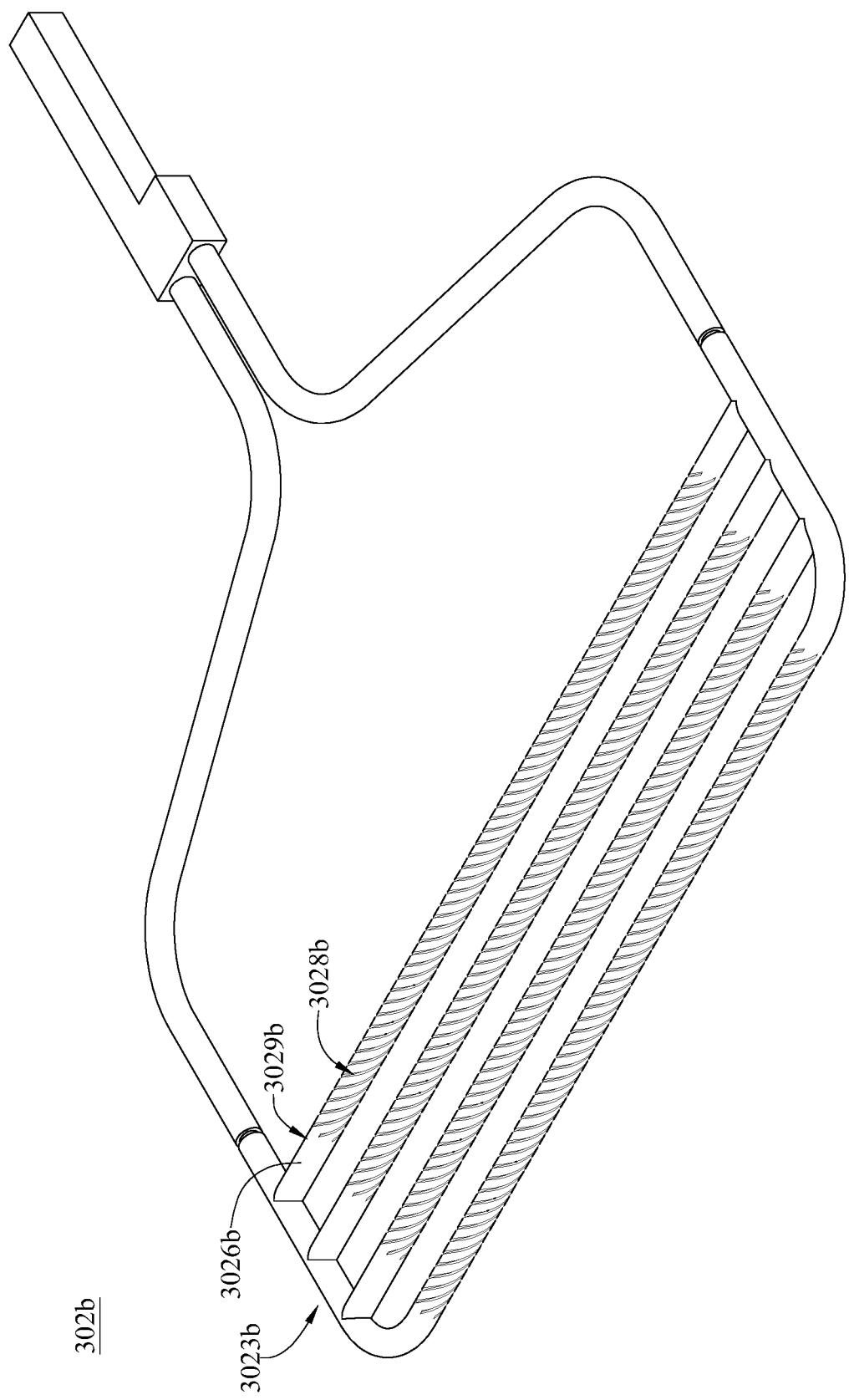
FIG. 6 is a perspective view of an electronic device according to a third embodiment of the invention.

Please refer to FIG. 6, there is shown a perspective view of an electronic device according to a third embodiment of the invention. The main difference between the electronic device shown in FIG. 6 and the electronic device shown in FIGS. 1 to 4 is the structure of the condensation portion of the tubing. Thus, only such difference will be described hereinafter, and the remaining part of the electronic device shown in FIG. 6 can be understood through the descriptions made by referring to FIGS. 1 to 4 and thus are not repeatedly described.

In this embodiment, a tubing 302b further includes a plurality of uneven structures 3028b. The uneven structures 3028b of the tubing 302b are respectively located on outer circumferential surfaces 3029b of connecting tube parts 3026b of a condensation portion 3023b. The uneven structures 3028b are, for example, spiral recesses.

According to the electronic device and the heat dissipation assembly disclosed by the above embodiments, the condensation portion of the tubing is located in the liquid-cooling accommodation space of the liquid-cooling plate that is configured for the liquid coolant to flow therein. Thus, heat can be transferred between the working fluid in the condensation portion of the tubing and the liquid coolant in the liquid-cooling plate merely via the wall of the condensation portion instead of via both of the top cover of the liquid-cooling plate and the wall of the condensation portion. In this way, heat can be effectively transferred between the working fluid in the condensation portion of the tubing and the liquid coolant in the liquid-cooling plate. Also, the connecting tube parts that are connected in parallel increase the flow rate of the working fluid in the condensation portion. Thus, the heat dissipation assembly is allowed to be applied to the heat source generating a large amount of heat.

Additionally, the uneven structures of the tubing are located on the outer circumferential surfaces of the connecting tube parts of the condensation portion. Therefore, the uneven structures increase the contact area between the liquid coolant in the liquid-cooling accommodation space and the connecting tube parts, and facilitates the formation of the turbulent flow of the liquid coolant in the liquid-cooling accommodation space of the liquid-cooling plate. In this way, the heat transferring efficiency between the working fluid in the condensation portion of the tubing and the liquid coolant in the liquid-cooling plate is further enhanced.

In an embodiment, the server (i.e., electronic device) disclosed by the invention can be applied to artificial intelligence (AI) computing, edge computing and can be used as 5G server, cloud computing server, or internet of vehicle server.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. An electronic device, configured to be connected to an external heat dissipation device, the electronic device comprising:
   a chassis, comprising a bottom plate, a wall and a partition, wherein the wall stands on a peripheral edge of the bottom plate, the partition stands on the bottom plate and is connected to two opposite sides of the wall, the partition comprises two through holes respectively located close to two opposite sides of the wall;
   a heat source, disposed on the chassis; and
   a heat dissipation assembly, comprising:
      an evaporator, in thermal contact with the heat source;
      a tubing, comprising an evaporation portion, a first connecting portion, a second connecting portion and a condensation portion, wherein the evaporation portion is in fluid communication with the condensation portion via the first connecting portion and the second connecting portion and is in thermal contact with the evaporator, and the first connecting portion and the second connecting portion of the tubing are respectively disposed through the two through holes; and
      a liquid-cooling plate, wherein the liquid-cooling plate is disposed on the chassis and is spaced apart from the heat source, the partition is located between the heat source and the liquid-cooling plate, the liquid-cooling plate comprises a liquid-cooling accommodation space and is configured to be in fluid communication with the external heat dissipation device, and the condensation portion of the tubing is located in the liquid-cooling accommodation space;
   wherein, the condensation portion of the tubing comprises a first tube part, a second tube part and a plurality of connecting tube parts, two opposite ends of each of the plurality of connecting tube parts are respectively in fluid communication with the first tube part and the second tube part, the plurality of connecting tube parts are connected in parallel, and the first tube part and the second tube part of the condensation portion are respectively in fluid communication with the first connecting portion and the second connecting portion of the tubing.

2. The electronic device according to claim 1, wherein the tubing further comprises a plurality of uneven structures that are respectively located on outer circumferential surfaces of the plurality of connecting tube parts of the condensation portion.

3. The electronic device according to claim 2, wherein the plurality of uneven structures are fins.

4. The electronic device according to claim 2, wherein the plurality of uneven structures are recesses.

5. The electronic device according to claim 1, wherein extension directions of the plurality of connecting tube parts of the condensation portion are substantially parallel to one another.

* * * * *